(12) United States Patent
Emami et al.

(10) Patent No.: US 6,299,698 B1
(45) Date of Patent: *Oct. 9, 2001

(54) WAFER EDGE SCRUBBER AND METHOD (75) Inventors: Ramin Emami, Sunnyvale; Brian J. Brown, Palo Alto, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,447

(22) Filed: Jul. 10, 1998

(51) Int. Cl.$^7$ ....................................................... B08B 1/04
(52) U.S. Cl. .................................. 134/6; 15/77; 15/88.2; 15/88.3; 15/102
(58) Field of Search .............................. 15/21.1, 77, 88.2, 15/88.3, 88.4, 97.1, 102; 134/6

(56) References Cited

U.S. PATENT DOCUMENTS

| | | | |
|---|---|---|---|
| 1,503,217 | * 7/1924 | Voulgares | ............................ 15/88.2 X |
| 2,394,338 | * 2/1946 | Stine | ................................ 15/88.3 |
| 3,640,029 | * 2/1972 | Zildjian | ............................. 15/88.2 X |
| 3,659,304 | * 5/1972 | Leonard | ................................ 15/88.3 |
| 5,200,571 | 4/1993 | Gracey | ............................. 15/104.9 X |
| 5,311,634 | 5/1994 | Andros | .................................... 15/97.1 |
| 5,317,778 | * 6/1994 | Kudo et al. | .............................. 15/77 X |
| 5,379,474 | * 1/1995 | Nakamura | ............................... 15/21.1 |
| 5,675,856 | 10/1997 | Itzkowitz | .................................. 15/77 |
| 5,725,414 | * 3/1998 | Moinpour et al. | ................. 15/88.3 X |
| 5,729,856 | 3/1998 | Jang et al. | .............................. 15/88.1 |
| 5,870,793 | * 2/1999 | Choffat et al. | ........................... 15/102 |
| 5,937,469 | * 8/1999 | Culkins et al. | ............................ 15/77 |

FOREIGN PATENT DOCUMENTS

| | | | |
|---|---|---|---|
| 123574 | * 2/1919 | (GB) | ...................................... 15/88.3 |
| 711598 | 7/1954 | (GB) . | |
| 772599 | 4/1957 | (GB) . | |

* cited by examiner

Primary Examiner—Mark Spisich
(74) Attorney, Agent, or Firm—Dugan & Dugan (57) ABSTRACT

An inventive brush and scrubbing device is provided for simultaneously scrubbing both planar and profiled (e.g., edge) surfaces of a thin disk such as a semiconductor wafer. The inventive brush has a contact surface having two portions, a planar portion for contacting a planar surface of a wafer, and a profiled portion for contacting an edge surface of a wafer. The profile of the profiled portion preferably follows the edge profile of a wafer to be cleaned by the brush. The profiled portion may have a higher modulus of elasticity than does the planar portion. Preferably the brushes are roller type PVA brushes having a plurality of nodules formed thereon.

30 Claims, 5 Drawing Sheets

WAFER EDGE SCRUBBER AND METHOD

The present invention relates generally to apparatuses and methods for cleaning thin discs, such as semiconductor wafers, compact discs, glass substrates and the like. More particularly, the invention relates to a scrubbing device for simultaneously scrubbing the entire surface of the thin disc, including the edges thereof.

BACKGROUND OF THE INVENTION

To manufacture a thin disc such as a semiconductor wafer, an elongated billet of semiconductor material is cut into very thin slices, about ½ mm in thickness. The slices or wafers of semiconductor material are then lapped and polished by a process that applies an abrasive slurry to the wafer's surfaces. After polishing, slurry residue conventionally is cleaned or scrubbed from wafer surfaces via a scrubbing device which employs polyvinyl acetate (PVA) brushes, brushes made from other porous or sponge-like material, or brushes made from nylon bristles or similar materials. Although these conventional cleaning devices remove a substantial portion of the slurry residue which adheres to wafer edges, slurry particles nonetheless remain and produce defects during subsequent processing.

A conventional PVA brush scrubber disclosed in U.S. Pat. No. 5,675,856 is shown in the side elevational view of FIG. 1. The conventional scrubber 11, shown in FIG. 1, comprises a pair of PVA brushes 13a, 13b. Each brush comprises a plurality of raised nodules 15 across the surface thereof, and a plurality of valleys 17 located among the nodules 15. The scrubber 11 also comprises a platform 19 for supporting a wafer W and a mechanism (not shown) for rotating the pair of PVA brushes 13a, 13b. The platform 19 comprises a plurality of spinning mechanisms 19a–c for spinning the wafer W.

Figure 1:
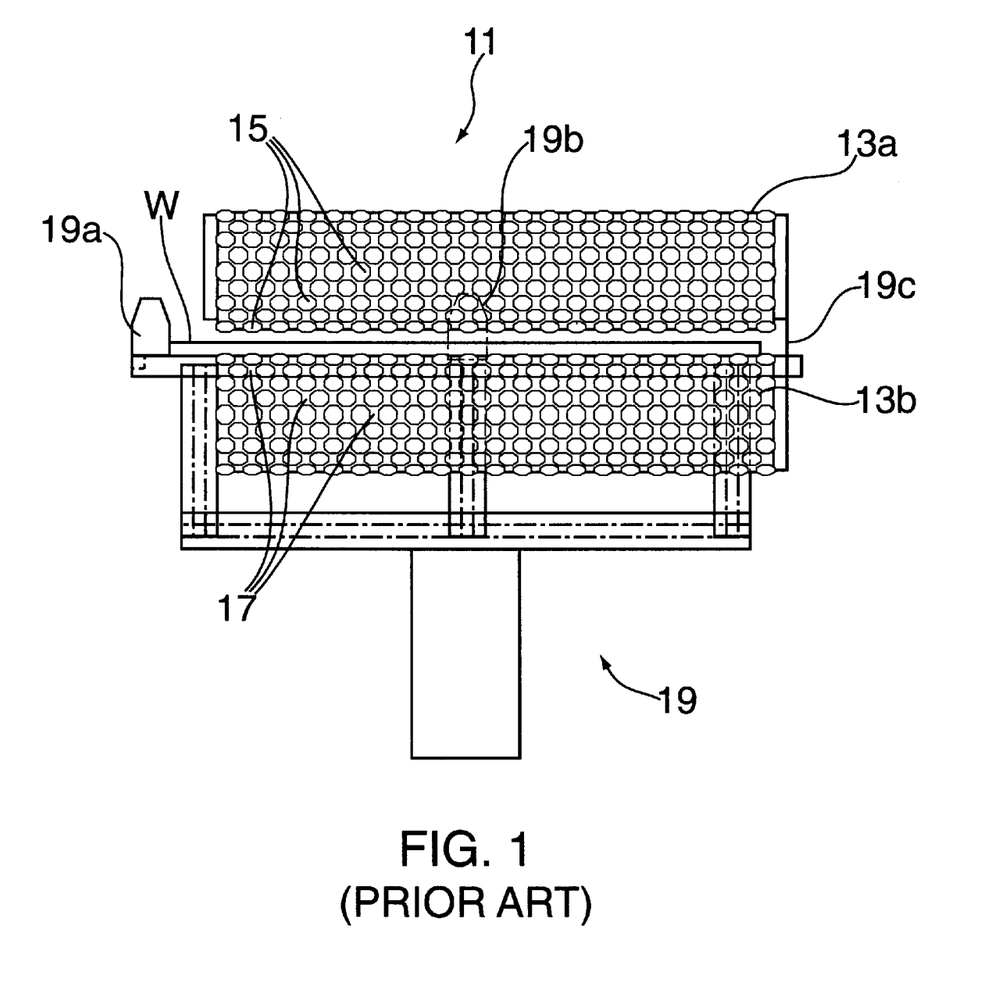
FIGS. 1 and 2 are schematic side elevational views of conventional wafer scrubbing devices, as previously described.

Preferably, the pair of PVA brushes 13a, 13b are positioned to extend beyond the edge of the wafer W, so as to facilitate cleaning the wafer's edges thereof. However, research shows that slurry induced defects still occur, and are caused by slurry residue remaining along the edges of the wafer despite cleaning with apparatuses such as that described above. Specifically, subsequent processing has been found to redistribute slurry residue from the wafer edges to the front of the wafer, causing defects.

Figure 2:
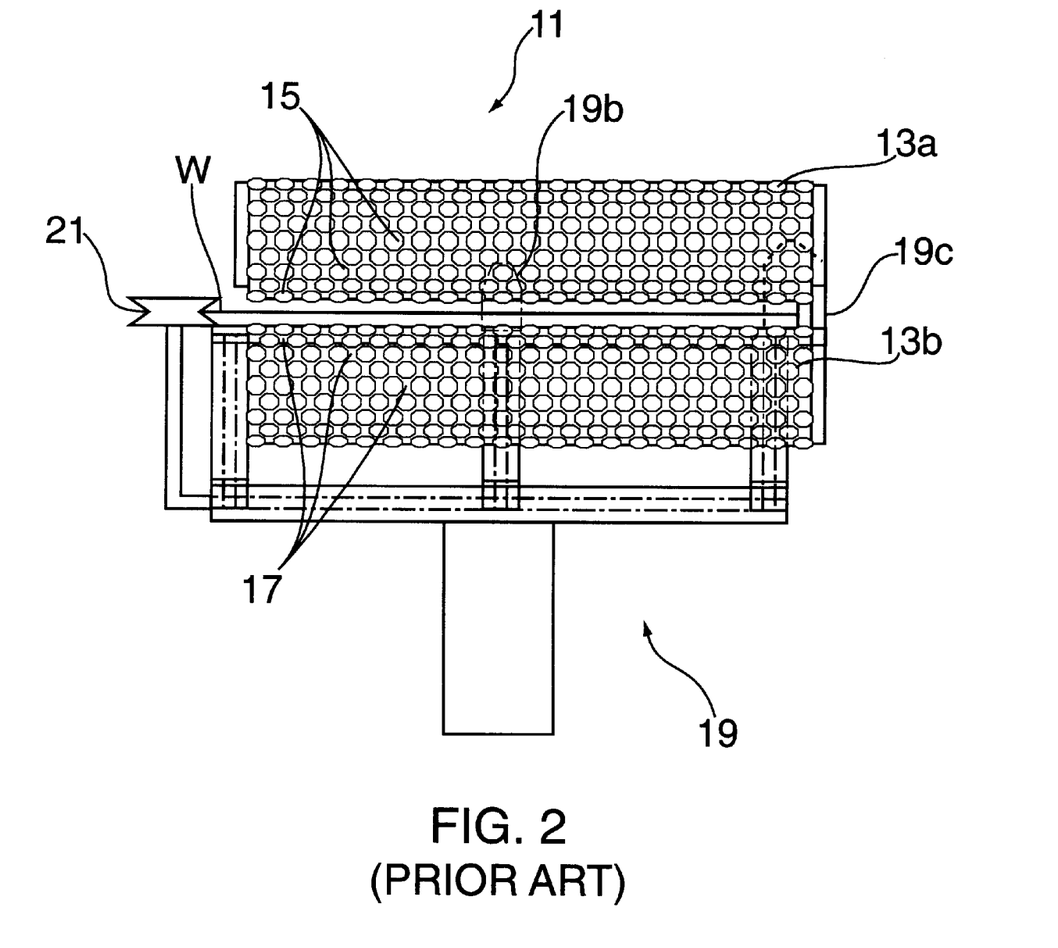

A number of devices have been developed to improve wafer edge cleaning. One such device is shown in the side elevational view of FIG. 2. This mechanism employs a separate edge brush 21, which is driven by a separate motor (not shown), that causes the edge brush 21 to rotate. The edge brush 21 fits over the edge of the wafer W as shown in FIG. 2, providing more effective wafer edge cleaning. Although the edge brush 21 addresses the need to clean slurry residue from wafer edges, it does so at the expense of increased scrubber complexity and cost, and requires additional solvents (e.g., water and ammonia) to maintain the cleanness of the edge brush 21 over an extended numbers of wafers.

Accordingly the field of wafer cleaning requires a method and apparatus which effectively cleans both the flat surfaces and the edge surfaces of a semiconductor wafer, and that does so without increased cost and complexity. In short, the semiconductor processing field needs an effective scrubber that satisfies the ever-present demand for reduced cost per unit wafer processed.

SUMMARY OF THE INVENTION

The present invention addresses the need for a more effective edge cleaner by providing a single brush which simultaneously scrubs both a planar surface and an edge surface of a thin disk such as semiconductor wafer. The brush comprises a wafer contacting surface which, during operation, cleans a wafer surface in contact therewith. The wafer contacting surface comprises a first portion for contacting the wafer along a substantially uniform plane; and a second portion for contacting the wafer along a profiled plane, such as an edge surface of the wafer.

The inventive brush preferably comprises a plurality of planar nodules for contacting the top or bottom planar surface of the wafer, and a plurality of profiled nodules for contacting the edge surface of the wafer. The profiled nodules are preferably elongated and extend to the end of the brush, having a profile which corresponds to the edge profile of a wafer to be cleaned by the inventive brush. It should be understood that as used herein, the profiled portion of the brush for contacting a wafer along a profiled plane has a profiled surface prior to contacting the wafer. The profiled nodules also may have a higher modulus of elasticity than that of the planar nodules.

A recessed area surrounds both the planar nodules and the profiled nodules forming a channel through which solvents and slurries may travel. The shape, spacing and number of nodules may vary broadly and still provide adequate wafer cleaning, as will be apparent to a worker of ordinary skill in the art.

The inventive brush may assume any shape required by a given wafer scrubbing device, the most common shapes being rollers or flat scrubbing surface devices (i.e., pancakes). Scrubbing devices which employ the inventive brush solve the long felt need for a highly effective and economical edge cleaner that reduces both manufacturing costs and costs associated with slurry induced defects.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 3A:
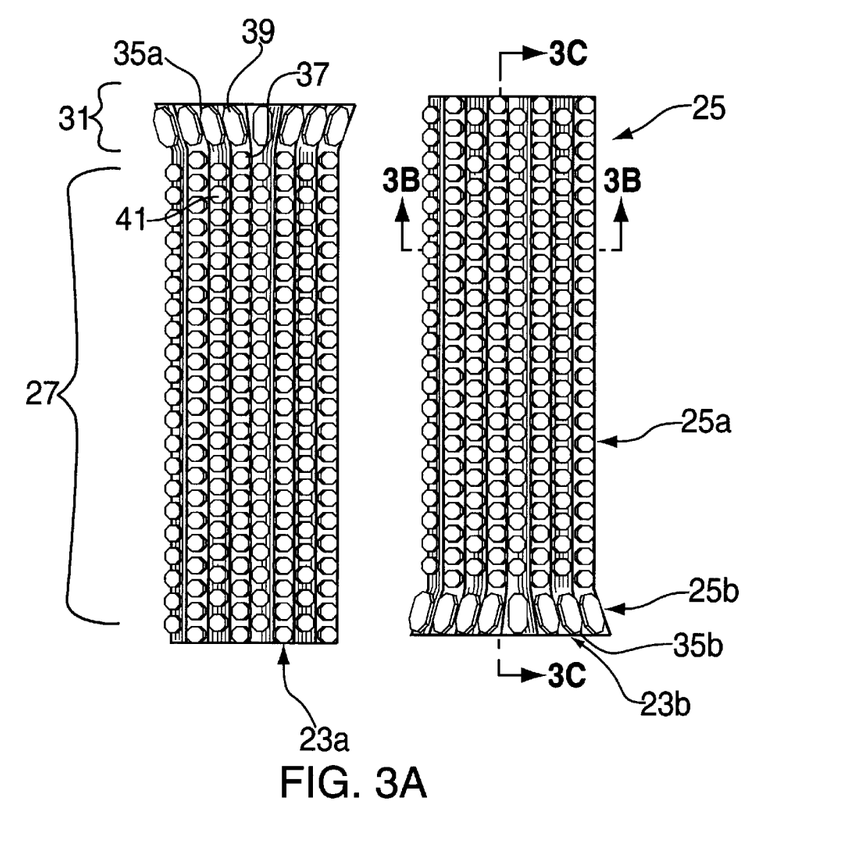
FIG. 3A is a top plan view of a pair of inventive brushes, in a preferred roller configuration.

FIG. 3A is a top plan view of a pair of inventive roller-type brushes 23a, 23b. Each of the brushes 23a, 23b comprises a wafer contacting surface 25 (i.e., the surface that contacts the wafer during polishing) which further comprises a first portion 27, having a planar contact surface 25a, and a second portion 31 having a profiled contact surface 25b positioned along at least one end 35a, 35b of each brush. When two of the inventive roller brushes 23a, 23b are used to simultaneously clean both the front and back surfaces of a wafer, the brushes are preferably positioned such that the ends 35a, 35b and the second portions 31 positioned thereon, are at opposite ends of the brushes 23a, 23b (i.e., laterally opposed) as shown in FIG. 3A.

Preferably both the first and second portions 27, and 31 have a plurality of nodules that contact the wafer during polishing. A first set of nodules 37 is located on the first portion 27 of the brush. The nodules 37 thus define the planar contact surface 25a. These planar nodules 37 are preferably circular for ease of manufacture. Rows of circular planar nodules 37 having a height $h_1$ of 0.21 inches, a diameter $d_1$ of 0.41 inches, and a spacing $x_1$ between adjacent nodules 37 of 0.2 inches have proven effective during testing on roller brushes 23a, 23b having a first outside diameter D1 of 2.72 inches and a second outside diameter D2 of 2.3 inches, as best understood with reference to the side sectional view of FIG. 3B, which is taken along line 3B—3B of FIG. 3A. The test brushes were made of PVA having a tensile strength of between 77–87 psi and an elongation at failure of between 230%–300%.

Similarly a second set of nodules 39 is located on the second portion 31 of the brush. The nodules 39 thus define the profiled contact surface 25b as best shown with reference to FIG. 3C which shows a side sectional view of both the brush of FIG. 3A taken along line 3C—3C, and a side sectional view of a wafer "w". These profiled nodules 39 are preferably elongated, having an elliptical or rectangular shape. A row of elliptical profiled nodules 39 having a height $h_2$ along the inside edges thereof of 0.735 inches, a height $h_3$ along the outside edges thereof of 0.7908 inches, a width equal to $d_1$ (FIG. 3B), a length $l_1$ of 0.75 inches, and a spacing between adjacent profiled nodules 39 of 0.58 inches has proven effective during testing on the roller brushes 23a, 23b described above. The profile (e.g., taper) between the inside edge height $h_2$ and the outside edge height $h_3$ preferably corresponds to the edge profile of the wafer w to be cleaned, as shown in FIG. 3C.

A recessed area 41 surrounds both the planar and the profiled nodules 37 and 39 so as to provide a channel through which solvents and slurries may travel. In this manner, slurry residue effectively cleaned from both the wafer's planar surfaces and from the wafer's edge surfaces by the planar and profiled brush portions 25a and 25b, respectively, may easily travel through the recessed area 41 until gravity and/or an auxiliary liquid flow removes the slurry residue from each brush, as further described below with reference to FIG. 4.

Figure 3B:
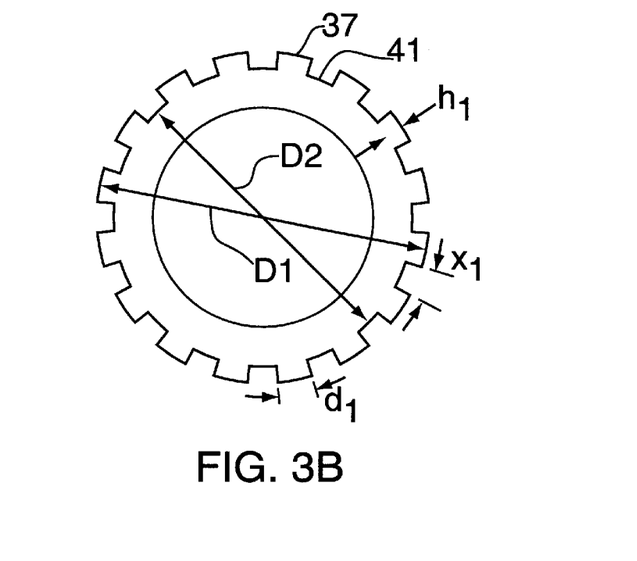
FIG. 3B is a side sectional view of the inventive brushes taken along line 3B—3B of FIG. 3A.
Figure 3C:
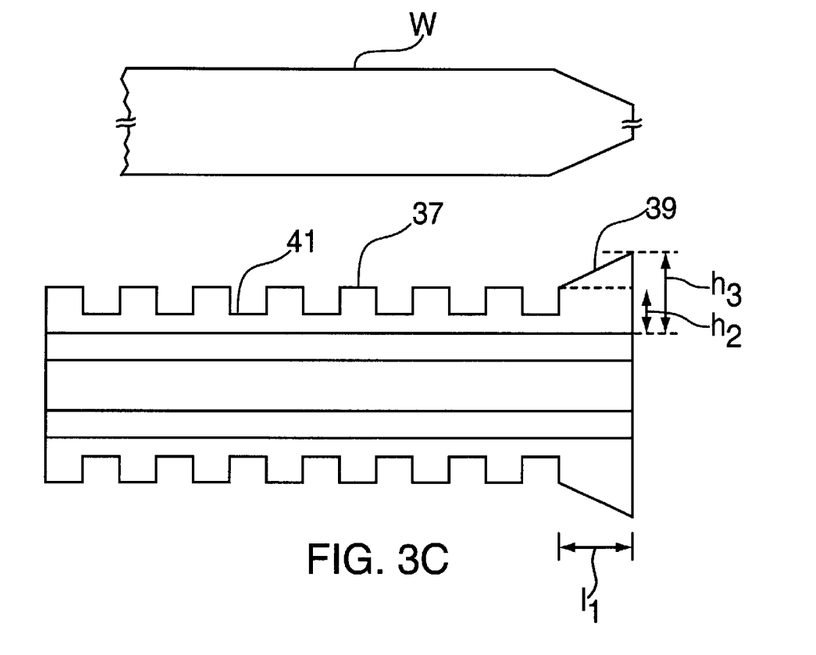
FIG. 3C is a side sectional view of the inventive brushes taken along line 3C—3C of FIG. 3A.
Figure 4:
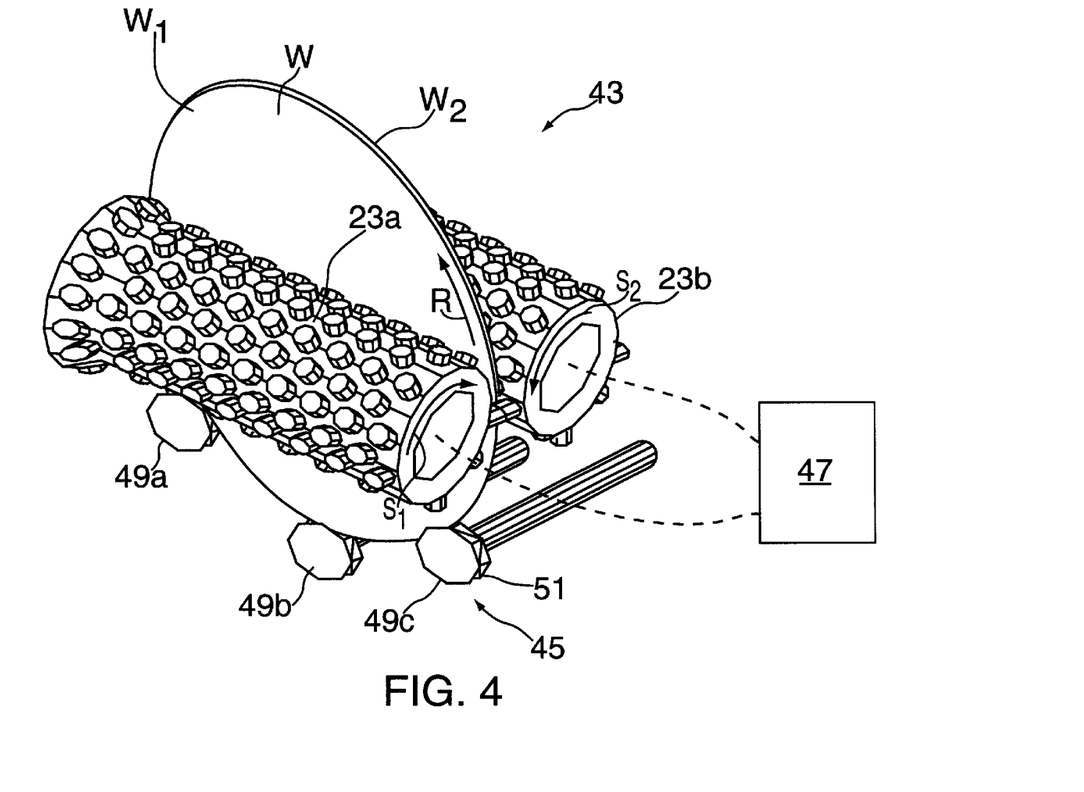
FIG. 4 is a side perspective view of an inventive scrubbing device that employs the rollers of FIGS. 3A–C.

FIG. 4 is a side perspective view of a scrubbing device 43 that employs the inventive brushes of FIGS. 3A–C, and is useful in describing the advantages provided by the present invention. As shown in FIG. 4, the inventive scrubbing device 43 comprises a platform 45 for supporting a wafer w to be cleaned. The first and second brushes 23a, 23b, described above, are operatively coupled to the platform 45 so as to contact both the planar and profiled portions of a first side $W_1$ of the wafer w, and the planar and profiled portions of a second side $W_2$ of the wafer w, respectively. A conventional spinning mechanism 47 such as a motor, represented generally by reference number 47, is operatively coupled to the first and second brushes 23a, 23b so as to selectively spin the first and second brushes 23a, 23b as described below. Further, a rotating mechanism (described below) is operatively coupled to the platform 45 so as to rotate the wafer w positioned thereon. Preferably, as shown in FIG. 4, the platform 45 comprises a plurality of rotating wheels 49a–c for both supporting and rotating the wafer w. Specifically, each rotating wheel 49a–c has a central notch or groove 51, having a sidewall angle (e.g., of 45°) such that only the very edge of the wafer w contacts the rotating wheels 49a–c. The notches thus prevent damage to the front or back wafer surfaces that may otherwise occur.

In operation, the first and second brushes 23a, 23b are initially in an open position (not shown), a sufficient distance from each other so as to allow a wafer to be inserted therebetween. Thereafter, the wafer w to be cleaned is positioned between the first and second brushes 23a, 23b and the brushes assume a closed position (FIG. 4), sufficiently close to each other so as to both hold the wafer w in place therebetween and to exert a force on the wafer surfaces sufficient to achieve effective cleaning. Mechanisms (not shown) for moving the brushes 23a, 23b between the open and closed positions are well known in the art and are therefore not further described herein.

Once the brushes 23a, 23b are in the closed position, the spinning mechanism 47 is engaged and the first and second brushes 23a, 23b begin to spin. Preferably the brushes 23a, 23b spin in opposite directions, as indicated by arrows S1 and S2 in FIG. 4, applying forces to the wafer w in a first direction (e.g., downward) while the wafer w rotates either clockwise or counterclockwise. This drives the wafer into the rotating wheels 49a–c, so that the wafer w remains captured thereby.

The top and bottom surfaces of wafer w are cleaned of slurry residue when contacted by the nodules 37, 39 of the first and second brushes 23a, 23b, respectively. More specifically, the first set of nodules 37 contact the flat surfaces of the wafer w, cleaning slurry residue therefrom, and the second set of nodules 39 contact the edge surfaces of the wafer w, cleaning slurry residue therefrom.

While the pair of brushes 23a, 23b spin, the rotating wheels 49a–c which engage the wafer's edge rotate causing the wafer w to rotate. Rotation of the wafer w ensures that the pair of brushes 23a, 23b contact each point along the surface of the wafer w. Because the brush profile of the inventive scrubbing device 43 is preferably designed to follow the wafer's profile, a uniform contact force is applied to both the flat surfaces and the profiled surfaces of the wafer w. In this manner, with use of only two brushes, uniform cleaning is achieved across the entire wafer surface. Preferably, the scrubbing device 43 is employed within an automated semiconductor device processing system having a loading station for receiving wafers, and a wafer handler for transferring wafers from the loading station to the scrubbing device 43.

Figure 5A:
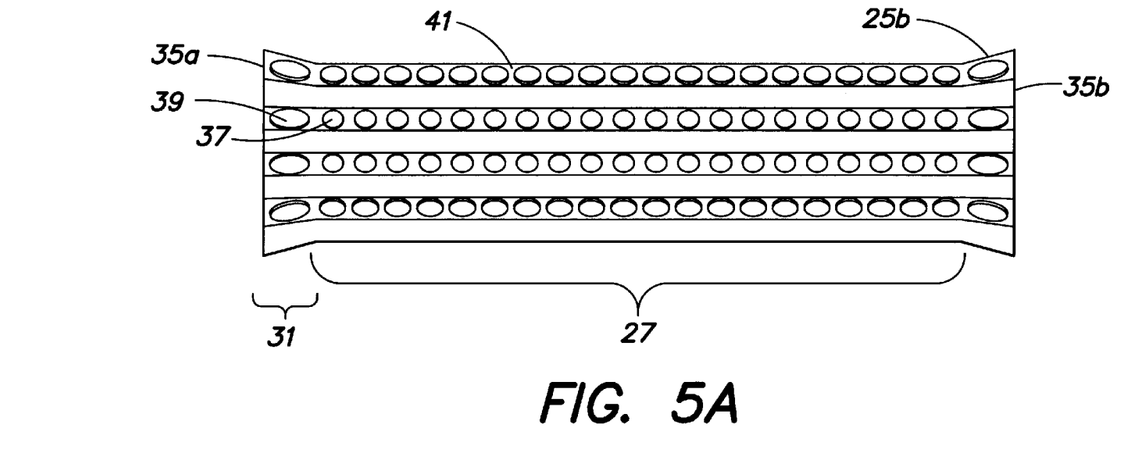
FIG. 5A is a top plan view of an inventive roller-type brush having a profiled portion on each end.
Figure 5B:
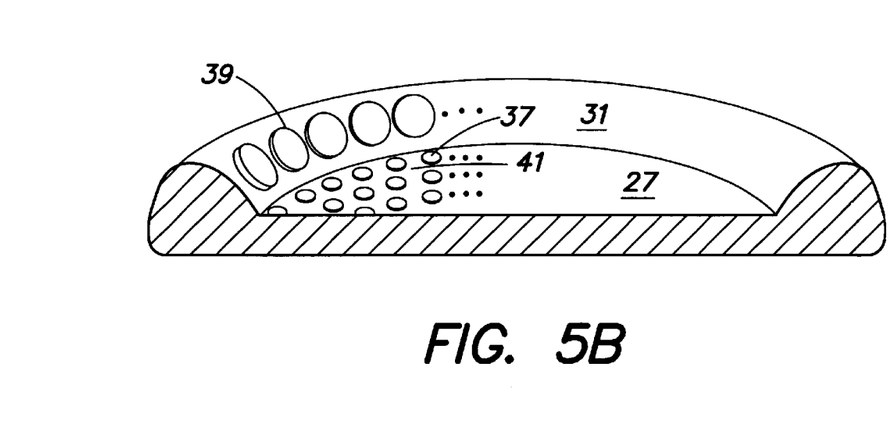
FIG. 5B is a sectional-perspective view of an inventive pancake-type brush having a profiled portion.

The foregoing description discloses only the preferred embodiments of the invention, modifications of the above disclosed apparatus and method which fall within the scope of the invention will be readily apparent to those of ordinary skill in the art. For instance, although inventive brushes are preferably PVA roller type brushes, they may be other types of brushes such as pancakes, disks, etc., and may comprise other materials such as nylon bristles, mohair, etc. The brushes may or may not employ nodules, and the nodules, if used, may assume any shape (e.g., square, octagonal, etc.). Although the brushes of FIGS. 3A–4 have only a single profiled end, both ends and/or other locations of a roller-type brush may have profiled portions (as shown in FIG. 5A), or the alternative edge contacting portion described herein, and numerous locations along, or the entire outer perimeter of a pancake-type brush may have profiled portions (as shown in FIG. 5B), or the alternative edge contacting portion described herein. Finally, it will be understood by those of ordinary skill in the art, that specific dimensions provided herein are merely exemplary of the presently preferred embodiment of the invention, and the invention is not to be limited thereby.

Accordingly, while the present invention has been disclosed in connection with the preferred embodiments thereof, it should be understood that other embodiments may fall within the spirit and scope of the invention, as defined by the following claims.

The invention claimed is:

1. An apparatus adapted to scrub a planar surface and an edge surface of a semiconductor wafer, comprising:
    a platform adapted to support a semiconductor wafer to be cleaned; and
    an elongated brush adapted to rotate about an axis parallel to the semiconductor wafer, the brush comprising:
        a cylindrical portion adapted to contact a planar surface of the semiconductor wafer;
        a profiled portion, located at the end of the cylindrical portion, adapted to contact the edge surface of the semiconductor wafer;
        the profiled portion as well as the cylindrical portion comprising a single piece of cleaning material with integral cleaning nodules extending therefrom, the cleaning nodules having substantially planar free ends; and
        the nodules of the profiled portion having a first height adjacent the cylindrical portion which is equal to the height of the nodules of the cylindrical portion and a second height at an end of the brush which is greater than the first height whereby the nodules of the profiled portion define an outwardly tapered cleaning surface which corresponds to an edge taper of the semiconductor wafer to be cleaned.

2. An apparatus adapted to scrub both a planar surface and an edge surface of a semiconductor wafer, comprising:
    a platform adapted to support a semiconductor wafer to be cleaned; and
    an elongated brush adapted to rotate about an axis parallel to the semiconductor wafer, the brush comprising:
        a cylindrical portion adapted to contact a planar surface of the semiconductor wafer;
        a profiled portion, located at the end of the cylindrical portion, adapted to contact the edge surface of the semiconductor wafer;
        the profiled portion as well as the cylindrical portion comprising a single piece of cleaning material with integral cleaning nodules extending therefrom; and
        the profiled portion having a first height adjacent the cylindrical portion which is equal to the height of the cylindrical portion and a second height at an end of the brush which is greater than the first height whereby the profiled portion defines an outwardly tapered cleaning surface which corresponds to an edge taper of the semiconductor wafer to be cleaned.

3. An apparatus adapted to scrub both a planar surface and an edge surface of a semiconductor wafer, comprising:
    an elongated brush adapted to rotate about an axis parallel to the semiconductor wafer, the brush comprising:
        a cylindrical portion adapted to contact a planar surface of the semiconductor wafer;
        a profiled portion, located at the end of the cylindrical portion, adapted to contact the edge surface of the semiconductor wafer;
        the profiled portion as well as the cylindrical portion comprising a single piece of cleaning material with integral cleaning nodules extending therefrom, the cleaning nodules having substantially planar free ends; and
        the nodules of the profiled portion having a first height adjacent the cylindrical portion which is equal to the height of the nodules of the cylindrical portion and a second height at an end of the brush which is greater than the first height whereby the nodules of the profiled portion define an outwardly tapered cleaning surface which corresponds to an edge taper of the semiconductor wafer to be cleaned.

4. An apparatus adapted to scrub both a planar surface and an edge surface of a semiconductor wafer, comprising:
    an elongated brush adapted to rotate about an axis parallel to the semiconductor wafer, the brush comprising:
        a cylindrical portion adapted to contact a planar surface of the semiconductor wafer;
        a profiled portion, located at the end of the cylindrical portion, adapted to contact the edge surface of the semiconductor wafer;
        the profiled portion as well as the cylindrical portion comprising a single piece of cleaning material with integral cleaning nodules extending therefrom; and
        the profiled portion having a first height adjacent the cylindrical portion which is equal to the height of the cylindrical portion and a second height at an end of the brush which is greater than the first height whereby the profiled portion defines an outwardly tapered cleaning surface which corresponds to an edge taper of the semiconductor wafer to be cleaned.

5. The brush of claim 4 further comprising a second profiled portion angled so an to follow the edge of the semiconductor wafer, and located at a second end of the cylindrical portion.

6. The brush of claim 4 wherein the nodules of the profiled portion are elongated.

7. The brush of claim 4 wherein the nodules of the profiled portion correspond to the profile of the semiconductor wafer's edge.

8. The brush of claim 4 wherein the nodules of the cylindrical portion have a first modulus of elasticity and the nodules of the profiled portion have a second modulus of elasticity, the second modulus of elasticity being greater than the first modulus of elasticity.

9. The brush of claim 4 wherein a recessed area surrounds the nodules so as to provide a channel through which liquids may travel.

10. The brush of claim 4 wherein the nodules of the profiled portion extend to an end of the brush.

11. The brush of claim 4 wherein the nodules of the cylindrical portion are circular.

12. The brush of claim 4 wherein the nodules of the profiled portion have a taper that corresponds to an edge taper of a semiconductor wafer to be cleaned.

13. A scrubbing device adapted to clean both a planar surface and an edge surface of a semiconductor wafer, comprising:
    a platform adapted to support a semiconductor wafer to be cleaned;
    a first apparatus as claimed in claim 4, operatively coupled to the platform so as to contact a first planar surface of the semiconductor wafer, and so as to contact at least a portion of an edge surface of the semiconductor wafer; and
    a spinning mechanism operatively coupled to the first apparatus so as to selectively cause the first apparatus to spin.

14. The scrubbing device of claim 13 wherein the platform comprises a plurality of wheels adapted to support and adapted to rotate a semiconductor wafer in a vertical position, and wherein the wheels are grooved so as to reduce contact with the semiconductor wafer.

15. The scrubbing device of claim 13 further comprising:
a second apparatus operatively coupled to the platform so as to contact a second planar surface of the semiconductor wafer;
wherein the spinning mechanism operatively couples to the second apparatus so as to selectively cause the second apparatus to spin.

16. The scrubbing device of claim 15 wherein the second apparatus comprises a semiconductor wafer contacting surface adapted to clean a semiconductor wafer in contact therewith, the semiconductor wafer contacting surface having a cylindrical portion adapted to contact the semiconductor wafer along a substantially uniform plane and a profiled portion angled so as to follow the edge of the semiconductor wafer, and wherein the second apparatus further contacts at least a portion of the edge surface of the semiconductor wafer.

17. The scrubbing device of claim 16 wherein the profiled portion of the first apparatus and the profiled portion of the second apparatus are laterally opposed.

18. The scrubbing device of claim 17 wherein the cylindrical portions of both the first apparatus and the second apparatus comprise a plurality of planar nodules adapted to contact the planar surfaces of the semiconductor wafer, and wherein the profiled portions of both the first apparatus and the second apparatus comprise a plurality of profiled nodules adapted to contact the edge of the semiconductor wafer, wherein the profile of the profiled nodules corresponds to a profile of the semiconductor wafer's edge.

19. An apparatus adapted to scrub both a planar surface and an edge surface of a semiconductor wafer, comprising:
a platform adapted to support a semiconductor wafer to be cleaned; and
a disc-shaped brush adapted to rotate about an axis perpendicular to the semiconductor wafer, the brush comprising:
an inner disc-shaped portion adapted to contact a planar surface of the semiconductor wafer;
a profiled portion, located along a perimeter of the inner disc-shaped portion, adapted to contact the edge surface of the semiconductor wafer;
the profiled portion as well as the inner disc-shaped portion comprising a single piece of cleaning material with integral cleaning nodules extending therefrom, the cleaning nodules having substantially planar free ends; and
the nodules of the profiled portion having a first height adjacent the inner disc-shaped portion which is equal to the height of the nodules of the inner disc-shaped portion and a second height at the periphery of the brush which is greater than the first height whereby the nodules of the profiled portion define an outwardly tapered cleaning surface which corresponds to an edge taper of the semiconductor wafer to be cleaned.

20. An apparatus adapted to scrub both a planar surface and an edge surface of a semiconductor wafer, comprising:
a platform adapted to support a semiconductor wafer to be cleaned; and
a disc-shaped brush adapted to rotate about an axis perpendicular to the semiconductor wafer, the brush comprising:
an inner disc-shaped portion adapted to contact a planar surface of the semiconductor wafer;
a profiled portion, located along a perimeter of the inner disc-shaped portion, adapted to contact the edge surface of the semiconductor wafer;
the profiled portion as well as the inner disc-shaped portion comprising a single piece of cleaning material with integral cleaning nodules extending therefrom; and
the profiled portion having a first height adjacent the inner disc-shaped portion which is equal to the height of the inner disc-shaped portion and a second height at the periphery of the brush which is greater than the first height whereby the profiled portion defines an outwardly tapered cleaning surface which corresponds to an edge taper of the semiconductor wafer to be cleaned.

21. An apparatus adapted to scrub both a planar surface and an edge surface of a semiconductor wafer, comprising:
a disc-shaped brush adapted to rotate about an axis perpendicular to the semiconductor wafer, the brush comprising:
an inner disc-shaped portion adapted to contact a planar surface of the semiconductor wafer;
a profiled portion, located along a perimeter of the inner disc-shaped portion, adapted to contact the edge surface of the semiconductor wafer;
the profiled portion as well as the inner disc-shaped portion comprising a single piece of cleaning material with integral cleaning nodules extending therefrom; and
the profiled portion having a first height adjacent the inner disc-shaped portion which is equal to the height of the inner disc-shaped portion and a second height at the periphery of the brush which is greater than the first height whereby the profiled portion defines an outwardly tapered cleaning surface which corresponds to an edge taper of the semiconductor wafer to be cleaned.

22. The brush of claim 21 wherein the nodules of the profiled portion are elongated.

23. The brush of claim 21 wherein the nodules of the profiled portion correspond to the profile of the semiconductor wafer's edge.

24. The brush of claim 21 wherein the nodules of the inner disc-shaped portion have a first modulus of elasticity and the nodules of the profiled portion have a second modulus of elasticity, the second modulus of elasticity being greater than the first modulus of elasticity.

25. The brush of claim 21 herein a recessed area surrounds the nodules so as to provide a channel through which liquids may travel.

26. The brush of claim 21 wherein the nodules of the profiled portion extend to a periphery of the brush.

27. The brush of claim 21 wherein the nodules of the inner disco-shaped portion are circular.

28. The brush of claim 21 wherein the nodules of the profiled portion have a taper that corresponds to an edge taper of a semiconductor wafer to be cleaned.

29. A method of scrubbing a semiconductor wafer comprising;
providing an elongated brush adapted to rotate about an axis parallel to a semiconductor wafer and to clean both a planar surface and an edge surface of the semiconductor wafer, the brush comprising:
a cylindrical portion adapted to contact a planar surface of the semiconductor wafer;

a profiled portion, located at the end of the cylindrical portion, adapted to contact the edge surface of the semiconductor wafer;

the profiled portion as well as the cylindrical portion comprising a single piece of cleaning material with integral cleaning nodules extending therefrom; and the profiled portion having a first height adjacent the cylindrical portion which is equal to the height of the cylindrical portion and a second height at an end of the brush which is greater than the first height whereby the profiled portion defines an outwardly tapered cleaning surface which corresponds to an edge taper of the semiconductor wafer to be cleaned;

placing the semiconductor wafer in contact with the brush such that the cylindrical portion of the brush contacts the planar surface of the semiconductor wafer and such that the profiled portion of the brush contacts the edge surface of the semiconductor wafer; and spinning the brush so as to clean both the planar and edge surfaces of the semiconductor wafer.

30. A method of scrubbing a semiconductor wafer comprising:

providing a disc-shaped brush adapted to rotate about an axis perpendicular to a semiconductor wafer and to clean both a planar surface and an edge surface of the semiconductor wafer, the brush comprising:

an inner disc-shaped portion adapted to contact a planar surface of the semiconductor wafer;

a profiled portion, located along a perimeter of the inner disc-shaped portion, adapted to contact the edge surface of the semiconductor wafer;

the profiled portion as well as the inner disc-shaped portion comprising a single piece of cleaning material with intefral cleaning nodules extending therefrom; and the profiled portion having a first height adjacent the inner disc-shaped portion which is equal to the height of the inner disc-shaped portion and a second height at the periphery of the brush which is greater than the first height whereby the profile portion defines an outwardly tapered cleaning surface which corresponds to an edge taper of the semiconductor wafer to be cleaned;

placing the semiconductor wafer in contact with the brush such that the inner disc-shaped portion of the brush contacts the planar surface of the semiconductor wafer and such that the profiled portion of the brush contacts the edge surface of the semiconductor wafer; and spinning the brush so as to clean both the planar and edge surfaces of the semiconductor wafer.

* * * * *